(12) United States Patent
Yokoi

(10) Patent No.: US 6,268,684 B1
(45) Date of Patent: Jul. 31, 2001

(54) PIEZOELECTRIC RESONATOR AND A PIEZOELECTRIC COMPONENT INCLUDING PIEZOELECTRIC RESONATOR

(75) Inventor: Yuko Yokoi, Toyama-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/397,838

(22) Filed: Sep. 16, 1999

(30) Foreign Application Priority Data

Sep. 21, 1998 (JP) ................................................. 10-265600

(51) Int. Cl.$^7$ ........................................................ H01L 41/08
(52) U.S. Cl. ........................... 310/366; 310/368; 310/357
(58) Field of Search ................................. 310/320, 321, 310/340, 344, 345, 348, 357, 366, 367, 368

(56) References Cited

U.S. PATENT DOCUMENTS

| | | | |
|---|---|---|---|
| 4,455,502 | * | 6/1984 | Nakatani ............................... 310/368 |
| 4,503,352 | * | 3/1985 | Inoue .................................... 310/359 |
| 5,973,442 | * | 10/1999 | Irie ....................................... 310/366 |

* cited by examiner

*Primary Examiner*—Thomas M. Dougherty
(74) *Attorney, Agent, or Firm*—Keating & Bennett, LLP

(57) ABSTRACT

A piezoelectric resonator includes a substantially rectangular shaped piezoelectric substrate having a pair of major surfaces and polarized in the thickness direction thereof and a pair of electrodes respectively disposed on the pair of major surfaces of the piezoelectric substrate. One of the electrodes is multiply divided along a dividing line which extends along the longitudinal direction of the piezoelectric substrate. The piezoelectric substrate is polarized such that two portions of the piezoelectric substrate sandwiching the dividing line are polarized in opposite directions.

12 Claims, 4 Drawing Sheets

Present Invention

Present Invention

PIEZOELECTRIC RESONATOR AND A PIEZOELECTRIC COMPONENT INCLUDING PIEZOELECTRIC RESONATOR

BACKGROUND OF THE INVENTION

1. Field of the Invention

The present invention relates to a piezoelectric resonator adapted to be vibrated in a longitudinal vibration mode for use in an oscillator or other electronic component, and a piezoelectric component including the piezoelectric resonator.

2. Description of the Related Art

A related piezoelectric resonator adapted to be vibrated in a longitudinal vibration mode is described in Japanese Utility Model Publication No. 59-9627 and Japanese Utility Model Publication No. 59-9628. In this resonator, an electrode provided on one major surface of a piezoelectric-ceramic substrate is divided in two by a linear groove extending in the longitudinal direction. A whole-surface electrode is provided on another major surface of the piezoelectric-ceramic substrate. Longitudinal vibration is excited by applying a signal between the electrodes on both major surfaces.

In order to generate a longitudinal vibration, the piezoelectric-ceramic substrate is uniformly polarized in the thickness direction. The electrode is divided in two by the above-mentioned groove so as to suppress a spurious response caused by the width vibration.

When the above described piezoelectric resonator is used in a surface mounting component as shown in FIG. 1, a conductive support member 43 is fixed to the divided electrode 41 provided on a piezoelectric resonator 40. The support member 43 is connected and fixed to one of the pattern electrodes 45 disposed on a substrate 44. Further, a whole-surface electrode 42 disposed on the piezoelectric resonator 40 opposite to the divided electrode 41 is connected to the other of the pattern electrodes 47 via the conductive wire 46. Further, the cover 48 which covers the piezoelectric resonator 44 is bonded to the substrate 44. However, if the wire 46 is used to connect the whole-surface electrode 42 disposed on the piezoelectric resonator 40 and the other of the pattern electrodes 45, the number of wiring steps and the number of parts increase.

Moreover, since a land 47a for a wire connection must be provided on the substrate 44, a gap between the wire 46 and the cover 48 must be provided and the width of the substrate 44 must be increased to avoid the connection therebetween. This results in the size of the cover 48 being undesirably increased.

SUMMARY OF THE INVENTION

To overcome the above described problems, preferred embodiments of the present invention provide a piezoelectric resonator which makes the process of electrical connection easy by providing input and output electrodes on one major surface of the piezoelectric resonator and which significantly reduces the number of parts and connection processes required for the resonator.

One preferred embodiment of the present invention provides a piezoelectric resonator including a substantially rectangular shaped piezoelectric substrate having a pair of major surfaces and polarized in the thickness direction, a pair of electrodes respectively disposed on the pair of major surfaces of the piezoelectric substrate, one of the electrodes being multiply divided at a dividing line which extends along the longitudinal direction of the piezoelectric substrate, the piezoelectric substrate being polarized such that two portions of the piezoelectric substrate sandwiching the dividing line are polarized in opposite directions.

In the prior art piezoelectric resonator, a longitudinal vibration is excited by applying an input and an output connection between a pair of electrodes which are disposed on a pair of major surfaces of the piezoelectric substrate. In contrast, in the case of the above described piezoelectric resonator according to a preferred embodiment of the present invention, a longitudinal vibration is excited by applying an input and an output connection between the pair of the divided electrodes, and thereby, at least one pair of electrodes disposed on the pair of major surfaces of the piezoelectric substrate does not have to be wired.

When the above described piezoelectric resonator is connected to an outer conductive member, only one of the major surfaces of the piezoelectric resonator is required to be connected to the outer conductive member. Thus, the connection process becomes simple and the size of the piezoelectric resonator is greatly reduced.

Further, focusing attention on a capacitance of the piezoelectric resonator, the piezoelectric resonator has an equivalent circuit which includes a pair of capacitors connected in series and having small electrode areas. Therefore, the capacitance is significantly lowered and thereby, the power consumption is greatly reduced.

In the above described piezoelectric resonator, one of the electrodes may be divided in two. One of the divided electrodes can function as an input electrode and another of the divided electrodes can function as an output electrode. In this case, the piezoelectric resonator can be arranged to define an oscillator having a simple structure.

In the above described piezoelectric resonator, a relationship $1.0 < B/A \leq 1.5$ may be satisfied where A is an area of the input (output) electrode and B is an area of the output (input) electrode. In this case, a longitudinal vibration can be generated efficiently while suppressing spurious response.

Another preferred embodiment of the present invention provides a piezoelectric component including the above described piezoelectric resonator, a pair of conductive support members respectively fixed to nodal portions at the pair of the divided electrodes disposed on the piezoelectric substrate, a pair of pattern electrodes provided on a mounting substrate, wherein the pair of conductive support members are respectively connected and fixed to the pair of pattern electrodes.

According to the above described piezoelectric component, wires which were previously required to be used are unnecessary. Further, a land for a wire connection is not needed on a mounting substrate, and thereby, the width of an mounting substrate is greatly reduced.

If a cover which covers the piezoelectric resonator is provided on the mounting substrate, a piezoelectric surface mounting type component is obtained easily.

Yet another preferred embodiment of the present invention provides a piezoelectric component including the above described piezoelectric resonator, a pair of conductive support members respectively fixed to nodal portions at the pair of the divided electrodes disposed on the piezoelectric substrate, wherein the pair of conductive support members are respectively connected and fixed to a pair of input-output lead terminals.

According to the above described piezoelectric component, it becomes unnecessary to bend a lead terminal in the thickness direction in accordance with a pair of major surfaces of the piezoelectric substrate. As a result, processing of a lead terminal becomes simple and the thickness of the piezoelectric component is greatly reduced.

Other features and advantages of the present invention will become apparent from the following description of the invention which refers to the accompanying drawings.

DETAILED DESCRIPTION OF PREFERRED EMBODIMENTS

Figure 1:
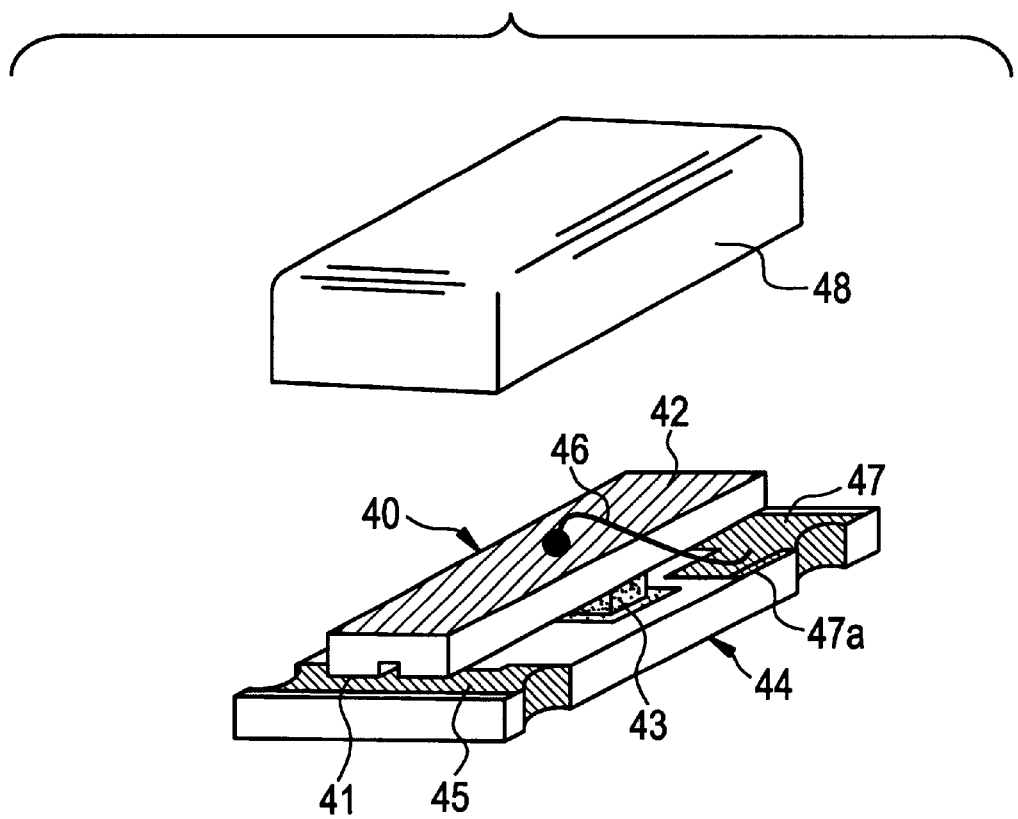
FIG. 1 is a perspective diagram of one example of a prior art surface mounting type piezoelectric component.
Figure 2:
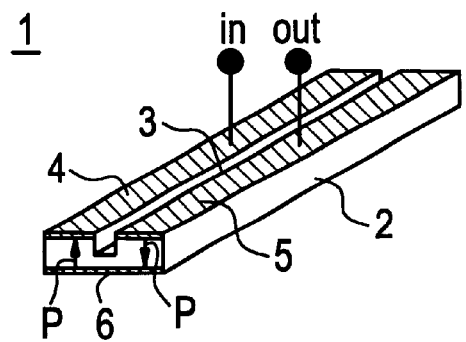
FIG. 2 is a perspective diagram of one preferred embodiment of a piezoelectric resonator of the present invention.

FIG. 2 shows one preferred embodiment of the piezoelectric resonator adapted to be vibrated in a longitudinal vibration mode. This resonator 1 preferably includes a substantially rectangular shaped piezoelectric-ceramic substrate 2. Two electrodes 4 and 5, which are divided by a linear groove 3 extending in the longitudinal direction of the piezoelectric-ceramic substrate 2, are disposed on one major surface of the piezoelectric substrate 2. The electrode 4 functions as an input (output) electrode. The electrode 5 functions as an output (input) electrode. The bipolar electrode 6 is disposed on substantially the entire other major surface of the piezoelectric substrate 2. The piezoelectric-ceramic substrate 2 is polarized such that two portions of the piezoelectric-ceramic substrate 2 sandwiching the linear groove 3 are polarized in the directions P opposite to each other. Therefore, a longitudinal vibration is excited when a predetermined frequency signal is applied between the input (output) electrode 4 and the output (input) electrode 5.

The above described groove 3 is preferably disposed at a position which is shifted toward one side relative to a center portion in the width-direction of the piezoelectric substrate 2. As a result, a relationship $1.0 < B/A \leq 1.5$ is preferably satisfied, where A is an area of the input (output) electrode 4 and B is an area of the output (input) electrode 5.

Figure 3:
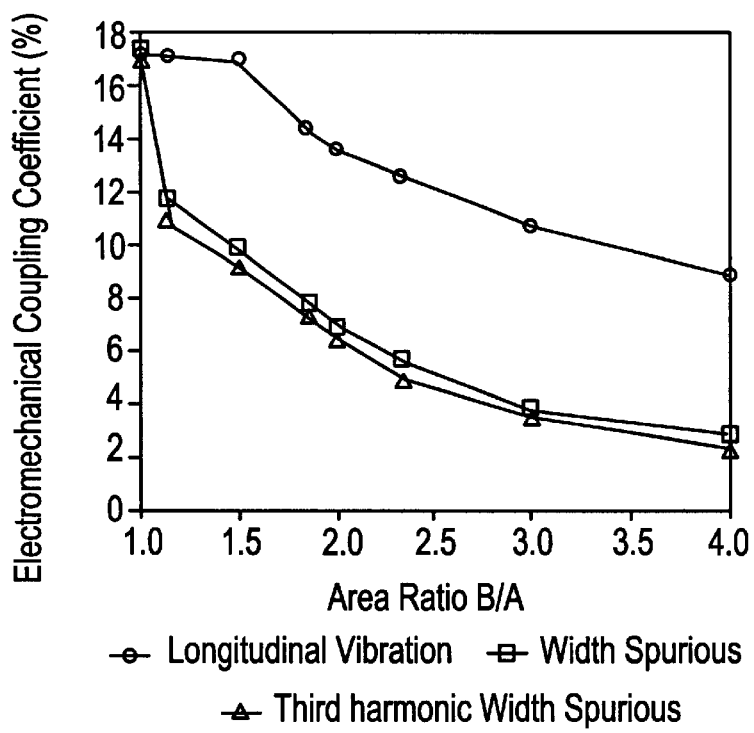
FIG. 3 is a diagram showing the relationship between the electrode area ratio of the piezoelectric resonator of FIG. 2 and an electromechanical coupling coefficient.

FIG. 3 shows changes in the electromechanical coupling coefficient (response) of the fundamental longitudinal vibration and the spurious (width spurious and width third harmonic spurious) response to changing the area ratios B/A. In this example, the length, width and thickness of a piezoelectric resonator (1) are preferably set to about 4.1 mm, about 0.9 mm and about 0.4 mm. The resonance-frequency Fr of the piezoelectric resonator (1) is about 445.27 kHz.

As apparent from FIG. 3, when B/A is equal to or less than about 1.5, the fundamental vibration response is hardly reduced while only the spurious response is reduced. When B/A is larger than about 1.5, it is not preferable because the fundamental vibration response is reduced in addition to the spurious response being reduced. Therefore, the most preferable result was obtained when B/A is equal to about 1.5.

In this preferred embodiment, the electrodes 4 and 5 are divided by the groove 3. However, other arrangements can be utilized to divide the electrodes 4 and 5. For example, the electrodes 4 and 5 can be divided by electrode patterning, etching, or other suitable dividing process or arrangement.

Figure 4:
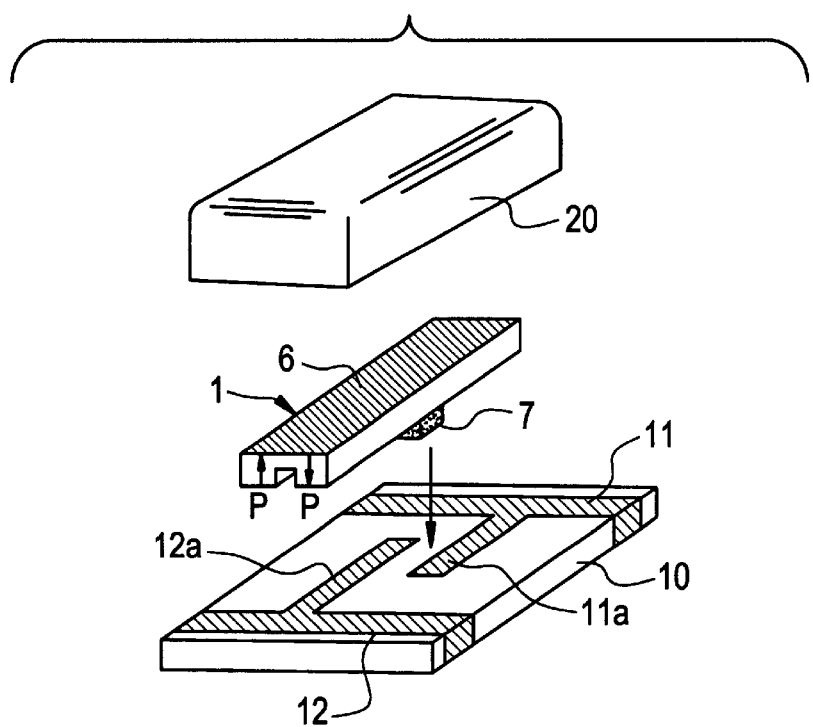
FIG. 4 is an exploded perspective view of one preferred embodiment of a piezoelectric component of the present invention.

FIG. 4 shows a surface mounting type oscillator including the above-described piezoelectric resonator 1. The oscillator preferably includes a piezoelectric resonator 1, a mounting substrate 10, and a cover 20.

Figure 5:
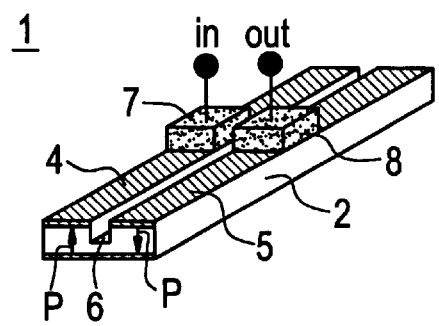
FIG. 5 is a perspective diagram viewed from the front side of the piezoelectric resonator for use in the piezoelectric component shown in FIG. 4.

As shown in FIG. 5, a pair of conductive support members 7 and 8 are respectively fixed to nodal portions (substantially central portions in the longitudinal direction of the piezoelectric resonator 1) at the pair of the divided electrodes 4 and 5. The conductive support members 7 and 8 are formed preferably by providing an electrically-conductive paste on the electrodes 4 and 5 having a thickness of about 100 micrometers and then hardening the paste, for example. Solder bumps, gold bumps or other suitable connecting members may be provided to form the conductive support members 7 and 8, as well.

The mounting substrate 10 is preferably a substantially rectangular shaped insulating thin plate which is made of alumina ceramics, glass-ceramic, a glass epoxy resin, or other suitable material. Input side and output side pattern electrodes 11 and 12 are disposed on one major surface of the mounting substrate 10 by well-known techniques, such as sputtering, deposition, and printing. A part of each of the pattern electrodes 11 and 12 extend to the other major surface of the mounting substrate 10 via the side edge of the mounting substrate 10. The resonator 1 is fixed and connected such that the input and output electrodes 4 and 5 may attach the pattern electrodes 11 and 12. That is, the support member 7 on the input electrode 4 is bonded to a connection portion 11a of the input-side pattern electrode 11, and the support member 8 on the output electrode 5 is bonded to a connection portion 12a of the output-side pattern electrode 12. A resonator 1 is disposed horizontally on the mounting substrate 10 so that the edge portion of the resonator 1 does not contact the surface of the mounting substrate 10. On the mounting substrate 10, the cover 20 which covers the resonator 1 in a non-contact state is bonded via an adhesive agent or other suitable connecting member. As a result, the perimeter of a resonator 1 is sealed. The cover 20 may be made from resin, metal, or other suitable material.

Although reflow soldering is performed in many cases at a circuit board or other similar component, in the case of a surface mounting type electronic component, reflow soldering does not inhibit the characteristic of a resonator 1 because the pattern electrodes 11 and 12 which overlap to another major surface of the mounting substrate 10 are provided and the perimeter of a resonator 1 on the mounting substrate 10 is sealed by the cover 20.

Further, a land portion for wire-connecting is not necessary to be provided on the mounting substrate 10 because it is not necessary to connect the bipolar electrode 6 disposed on the other major surface of the resonator 1 and the mounting substrate 10 with a wire or other connector. Consequently, the width of the mounting substrate 10 can be greatly reduced. Furthermore, because a wire is not needed, a gap between the interior of the cover 20 and the resonator 1 can be made very small. As a result, the size of the cover 20 can be significantly reduced.

Figure 6A:
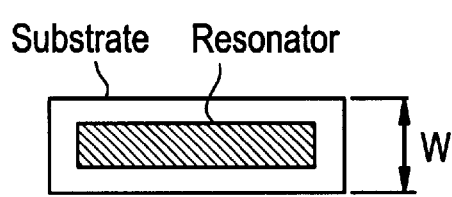
FIG. 6 is a comparison diagram of the mounting area of one preferred embodiment of the piezoelectric component of the present invention and that of a prior art piezoelectric component.
Figure 6B:
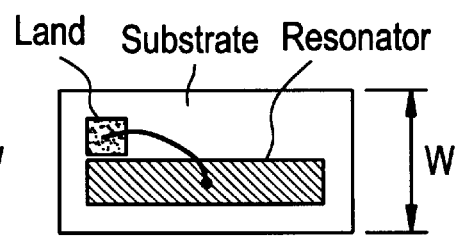
Figure 7A:
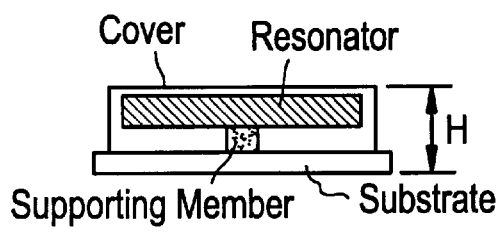
FIG. 7 is a comparison diagram of the thickness of one preferred embodiment of the piezoelectric component of the present invention and that of a prior art piezoelectric component.
Figure 7B:
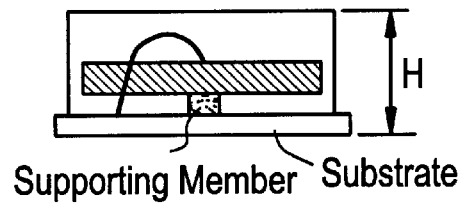

FIG. 6 and FIG. 7 show an example which compares the size of the piezoelectric component of a preferred embodiment of the present invention with that of a prior art piezoelectric component.

FIG. 6 shows a comparison of mounting areas. In the prior art example, since the land for a wire connection was required at the side of the mounting part of the resonator, the width W of the mounting substrate must be at least 4.0 mm. However, in preferred embodiments of the present invention, because the resonator can be disposed at the approximate center portion of the mounting substrate, the width W of the mounting substrate can be decreased to about 3.0 mm. That is, the width W can be shortened to about 25% and the surface mounting area is greatly reduced.

FIG. 7 shows a comparison of thicknesses. In the prior art example, since a space between the resonator and the cover for accommodating a wire was required, a total-height H of a piezoelectric component must be at least 3.0 mm. However, in preferred embodiments of the present invention, because a space between the resonator and the cover for accommodating a wire is not required, a total-height H of the piezoelectric component has been decreased to about 1.5 mm. That is, the total-height H can be decreased to about half, and low-profiling can be achieved.

Figure 8:
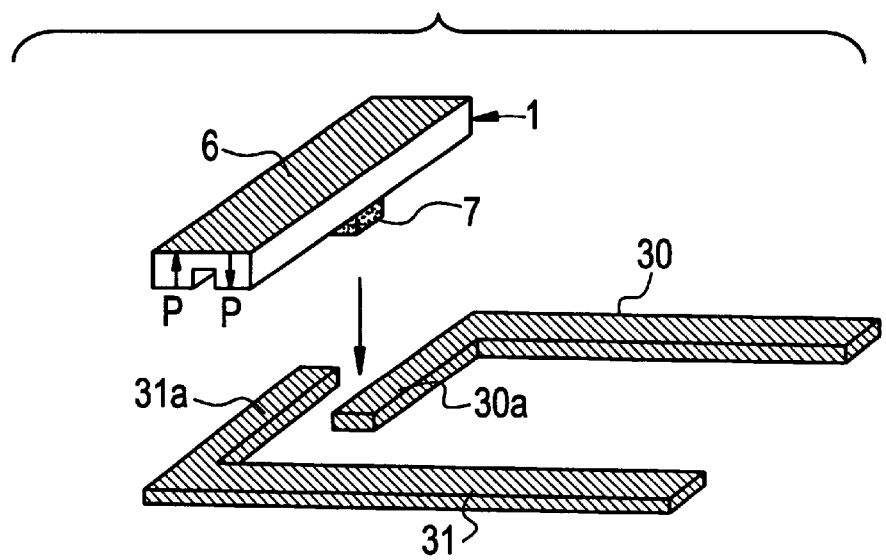
FIG. 8 is a perspective diagram of the another preferred embodiment of a piezoelectric component of the present invention.

FIG. 8 shows another preferred embodiment of a piezoelectric component, in which the above described piezoelectric resonator 1 is mounted on lead terminals 30 and 31. In this preferred embodiment, the connecting portions 30a and 31a of the lead terminals 30 and 31 are arranged in parallel relative to the position of the support members 7 and 8 disposed on the piezoelectric resonator 1. The support members 7 and 8 are fixed and connected to the connecting portions 30a and 31a via soldering, electroconductive adhesive, or other suitable material. Then, the piezoelectric component with the lead terminals is sealed in a case via dip sealing of the perimeter of a resonator 1. The dip sealing is performed using silicone rubber and outer-cladding resin, for example.

In this case, since a lead terminal is not required to be connected to the electrode 6 disposed on the other major surface of the resonator 1, the lead terminals 7 and 8 can be arranged in a planar configuration. Further, processing and connection of the lead terminals 7 and 8 become simple while the exterior size of the piezoelectric component is greatly reduced.

The present invention is not limited to the above described preferred embodiments. In the above described preferred embodiments, the electrode on one major surface of the piezoelectric resonator is divided in two by one groove. However, the electrode may be divided into three parts via two grooves. In this case, a center electrode and the other two electrodes may function as an input (output) electrode and output (input) electrodes, respectively.

When the piezoelectric resonator constitutes a surface mounting type piezoelectric component, a plurality of the piezoelectric resonators can be disposed on one mounting substrate. In this case, a ladder type filter or a Colpitts type oscillation circuit can be achieved by providing an appropriate pattern electrode on the mounting substrate.

The piezoelectric resonator of preferred embodiments of the present invention is not restricted to an embodiment in which wiring is not performed and a wire is not disposed on the electrode on the other major surface of the piezoelectric resonator (bipolar electrode). For example, a filter can be constituted by connecting a wire for grounding the electrode on the other major surface of the piezoelectric resonator.

Figure 9A:
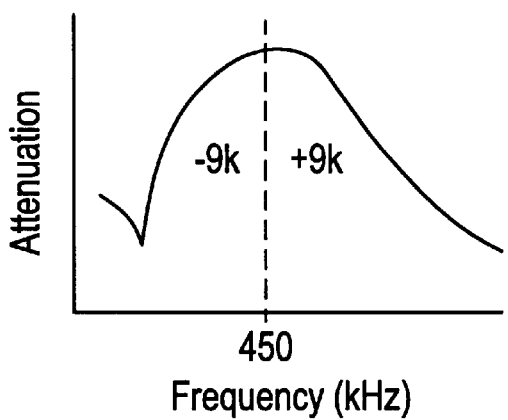
FIG. 9A and FIG. 9B are characteristic comparison diagrams when a piezoelectric resonator of the present invention is used to define a filter.
Figure 9B:
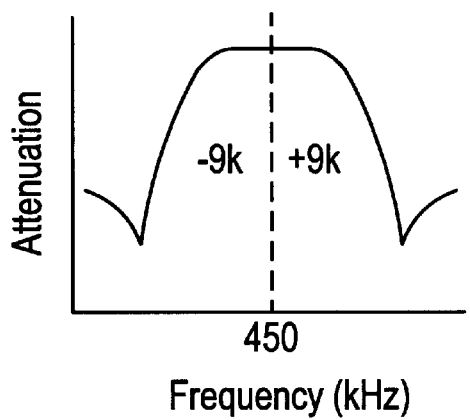

FIG. 9A and FIG. 9B are characteristic comparison diagrams when a piezoelectric resonator of preferred embodiments of the present invention is used in a filter. FIG. 9A shows a filter characteristic when the piezoelectric substrate is polarized such that two portions of the piezoelectric substrate sandwiching the dividing line are polarized in the same direction. FIG. 9B shows a filter characteristic when the piezoelectric substrate is polarized such that two portions of the piezoelectric substrate sandwiching the dividing line are polarized in opposite directions.

As apparent from FIGS. 9A and 9B, when the two portions of the piezoelectric substrate sandwiching the dividing line are polarized in opposite directions, an attenuation characteristic at the side of +9 k is improved and thereby the selectivity is improved.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
   a piezoelectric substrate having a pair of major surfaces and being polarized in a thickness direction;
   a pair of electrodes respectively disposed on the pair of major surfaces of the piezoelectric substrate; wherein one of the pair of electrodes is divided into two separate electrode portions via a dividing line which extends along a longitudinal direction of the piezoelectric substrate, and the piezoelectric substrate is polarized such that two portions of the piezoelectric substrate sandwiching the dividing line are polarized in opposite directions, a first of the two separate electrode portions divided via the dividing line defines an input electrode and a second of the two separate electrode portions divided via the dividing line defines an output electrode;
   a relationship 1.0<B/A<1.5 is satisfied where A is the area of one of the input electrode and the output electrode and B is the area of the other of the input electrode and the output electrode.

2. The piezoelectric resonator according to claim 1, wherein a first of the two separate electrode portions is an input electrode and a second of the two separate electrode portions is an output electrode.

3. The piezoelectric resonator according to claim 1, wherein the dividing line is a first dividing line and a second dividing line is provided so as to divide the one of the pair of electrodes into three separate electrode portions.

4. The piezoelectric resonator according to claim 3, wherein the first dividing line and the second dividing line are linear grooves formed in the piezoelectric substrate.

5. The piezoelectric resonator according to claim 1, wherein the dividing line comprises at least one linear groove formed in the piezoelectric substrate.

6. The piezoelectric resonator according to claim 1, wherein the piezoelectric substrate has a substantially rectangular shape.

7. A piezoelectric component, comprising a piezoelectric resonator including:

a piezoelectric substrate having a pair of major surfaces and being polarized in a thickness direction;

a pair of electrodes respectively disposed on the pair of major surfaces of the piezoelectric substrate; wherein one of the pair of electrodes is divided into two separate electrode portions via a dividing line which extends along a longitudinal center line of the piezoelectric substrate extending along a longitudinal direction of the piezoelectric substrate, and the piezoelectric substrate is polarized such that two portions of the piezoelectric sandwiching the dividing line are polarized in opposite directions, a first of the two separate electrode portions divided via the dividing line defines an input electrode and a second of the two separate electrode portions divided via the dividing line defines an output electrode;

a relationship $1.0<B/A<1.5$ is satisfied where A is the area of one of the input electrode and the output electrode and B is the area of the other of the input electrode and the output electrode;

a pair of conductive support members respectively fixed to nodal portions of the two separate electrode portions disposed on the piezoelectric substrate;

a pair of pattern electrodes provided on a mounting substrate; wherein the pair of conductive support members are respectively connected and fixed to the pair of pattern electrodes.

8. The piezoelectric component according to claim 7, wherein a first of the two separate electrode portions is an input electrode and a second of the two separate electrode portions in an output electrode.

9. The piezoelectric component according to claim 7, wherein the dividing line comprises at least one linear groove formed in the piezoelectric substrate.

10. The piezoelectric component according to claim 7, wherein the piezoelectric substrate has a substantially rectangular shape.

11. The piezoelectric component according to claim 7, wherein the dividing line is a first dividing line and a second dividing line is provided so as to divide the one of the pair of electrodes into three separate electrode portions.

12. The piezoelectric component according to claim 11, wherein the first dividing line and the second dividing line are linear grooves formed in the piezoelectric substrate.

* * * * *